United States Patent [19]
Hickernell et al.

[11] Patent Number: 5,212,420
[45] Date of Patent: May 18, 1993

[54] METHOD AND APPARATUS FOR SURFACE ACOUSTIC WAVE REFLECTOR GRATING

[75] Inventors: Thomas S. Hickernell, Tempe; David Penunuri, Fountain Hills; Frederick Y. Cho, Scottsdale, all of

[73] Assignee: Motorola, Inc., Schaumburg, Ill.

[21] Appl. No.: 754,477

[22] Filed: Sep. 3, 1991

[51] Int. Cl.⁵ .......................................... H01L 41/08
[52] U.S. Cl. ...................... 310/313 D; 310/313 B; 333/195
[58] Field of Search ............... 310/313; 333/150-156, 333/193-196

[56] References Cited

U.S. PATENT DOCUMENTS

| | | | |
|---|---|---|---|
| 3,886,504 | 5/1975 | Hartmann et al. | 310/313 D X |
| 4,072,915 | 2/1978 | Mitchell | 310/313 D X |
| 4,249,146 | 2/1981 | Yen et al. | 333/195 |
| 4,427,956 | 1/1984 | Murray | 310/313 D X |
| 4,634,914 | 1/1987 | Balato | 310/313 D |
| 4,635,009 | 1/1987 | Ebata | 310/313 D X |
| 4,742,319 | 5/1988 | Sone | 333/195 |
| 4,760,359 | 7/1988 | Shiba et al. | 333/194 |
| 4,837,476 | 6/1989 | Mochizuki | 310/313 |
| 5,051,644 | 9/1991 | Wright | 310/313 B |
| 5,061,871 | 10/1991 | Wright | 310/313 B |

OTHER PUBLICATIONS

F. Hickernell, M. Adamo, Motorola Government Electronics Division, Scottsdale, Arizona, entitled "An Integrated ZnO/Si-MOSFET Programmable Matched Filter", 1975 Ultrasonics Symposium Proceedings, IEEE Cat., pp. 223-226.

P. V. Wright, RF Monolithics Inc., Dallas, Texas, entitled "Modeling and Experimental Measurements of the Reflection Properties of SAW Metallic Gratings", 1984 Ultrasonics Symposium, IEEE 1984, pp. 54-63.

D. Penunuri, F. M. Fliegel, F. S. Hickernell, and F. Y. Cho, Motorola, Inc. Government Electronics Group, Scottsdale Arizona, entitled "Single-Phase, Unidirectional Transducer Design for Charge Transport Devices", 1990 Ultrasonics Symposium, IEEE, 1990, pp. 237-241.

Primary Examiner—Mark O. Budd
Attorney, Agent, or Firm—Frederick M. Fliegel

[57] ABSTRACT

An acoustic wave device comprises an acoustic wave transducer coupled to an acoustic wave propagating substrate. The acoustic wave transducer converts signal energy between electrical and acoustical forms. Acoustic reflectors are placed one on either side of the acoustic wave transducer. The acoustic reflectors are composed of acoustic reflection elements spaced approximately one wavelength apart, and provide enhanced acoustic acoustic reflections together with relaxed fabrication constraints.

22 Claims, 6 Drawing Sheets

FREQUENCY IN MEGAHERTZ
(CENTER = 944 MHZ; 2.5 MHZ/DIVISION)

METHOD AND APPARATUS FOR SURFACE ACOUSTIC WAVE REFLECTOR GRATING

CROSS REFERENCE TO RELATED APPLICATIONS

This application is related to co-pending U.S. patent application Ser. Nos. 733,933; 694,516; and 504,506, which are assigned to the same assignee as the present invention.

FIELD OF THE INVENTION

The present invention pertains to microelectronic devices employing acoustic waves and more particularly to frequency selection components employing acoustic wave reflectors.

BACKGROUND OF THE INVENTION

A broad variety of new demands is being placed on the electromagnetic spectrum, leading to difficulty in allocating radio wave frequency bands as new kinds of equipment based on radio wave communication are developed.

Such demands provide pressure to employ progressively higher radio frequencies (e.g., >500 MegaHertz) and need to utilize spectral space more efficiently. These trends create requirements for frequency selection components capable of high frequency operation and increasingly narrow passbands. Additionally needed are devices having low insertion loss coupled with improved out-of-band signal rejection, in a small form factor and with low power consumption.

Acoustic wave devices are becoming particularly important in the construction of electronic signal processing equipment, such as radios, paging devices, and other high frequency electronic apparatus, because they can be readily constructed on planar surfaces using integrated circuit fabrication techniques, are robust and compact, require no initial or periodic adjustment, and consume no static power.

A basic equation describing signal frequency $f_{sig}$, acoustic wavelength $\lambda$, and properties of the acoustic medium is:

$$\lambda f_{sig} = v_s, \tag{1}$$

where $v_s$ represents acoustic velocity in the acoustic medium. For a given acoustic velocity $v_s$, increased $f_{sig}$ requires reduced $\lambda$.

Wave propagating acoustic transducers rely on electrodes which are usually a fraction of a wavelength in width. Photolithographi constraints together with Eq. 1 determine an upper frequency limit by setting a lower electrode width limit. The current minimum electrode width is about one micrometer for practical mass-production equipment and techniques. This minimum electrode width sets the upper frequency limit between about one and two GigaHertz. At present, this is a frequency range of intense interest for development of new electronic products.

Control of fabrication variables, such as the ratio of refection element width to reflection element period (also known as metallization ratio), metal thickness, and the like, becomes progressively more difficult as photolithographic limits are approached, i.e., as the desired reflection element widths become smaller. This results in reduced fabrication yields for devices requiring reflection element widths at or near the photolithographic and etching limits.

A further problem lies in the fact that conventional techniques employing two reflection elements per wavelength provide only limited acoustic reflectivity per reflecting element in an acoustic device. This gives rise to reduced bandwidth and increased insertion loss.

Yet another problem encountered for surface acoustic wave (SAW) resonators results from the very narrow bandwidths of such devices, coupled with the sensitivity of the center frequency to fabrication-induced velocity variations.

Thus, SAW resonators employing increased linewidths and having improved (broader) bandwidth, or reduced Q, are extremely desirable for high frequency filtering applications.

What is needed are a device and techniques for device realization which are minimally sensitive to manufacturing variations, which maximize device performance while minimizing component size, and which are easily implemented in a fashion consistent with current acoustic device design, fabrication and use practices.

SUMMARY OF THE INVENTION

In accordance with the present invention, a novel method and apparatus for an acoustic wave device reflector arrangement are disclosed.

The novel acoustic wave device comprises an acoustic wave transducer coupled to an acoustic wave propagating substrate. The transducer converts signal energy between electrical and acoustical forms. Acoustic reflectors are placed on either side of the acoustic wave transducer, the acoustic reflectors being composed of acoustic reflection elements spaced one acoustic wavelength apart.

A method for making an electro-acoustic device comprising the steps of providing an acoustic wave propagating substrate, coupling a first acoustic transducer structure to the substrate, and disposing two groups of reflection elements on the substrate and to either side of the acoustic transducer, wherein the individual reflection elements have a periodicity of one reflection element per acoustic wavelength.

The above and other features and advantages of the present invention will be better understood from the following detailed description taken in conjunction with the accompanying drawings.

DETAILED DESCRIPTION OF THE PRIOR ART

Acoustic wave devices including surface acoustic wave (SAW) devices operate at UHF and VHF frequencies, ranging from several tens of MegaHertz to several GigaHertz, where other types of frequency selection components operate with limited effectiveness. The terms "acoustic wave", "surface acoustic wave" and "SAW" are used interchangeably herein to refer to microwave acoustic energy propagating in solid media.

Figure 1:
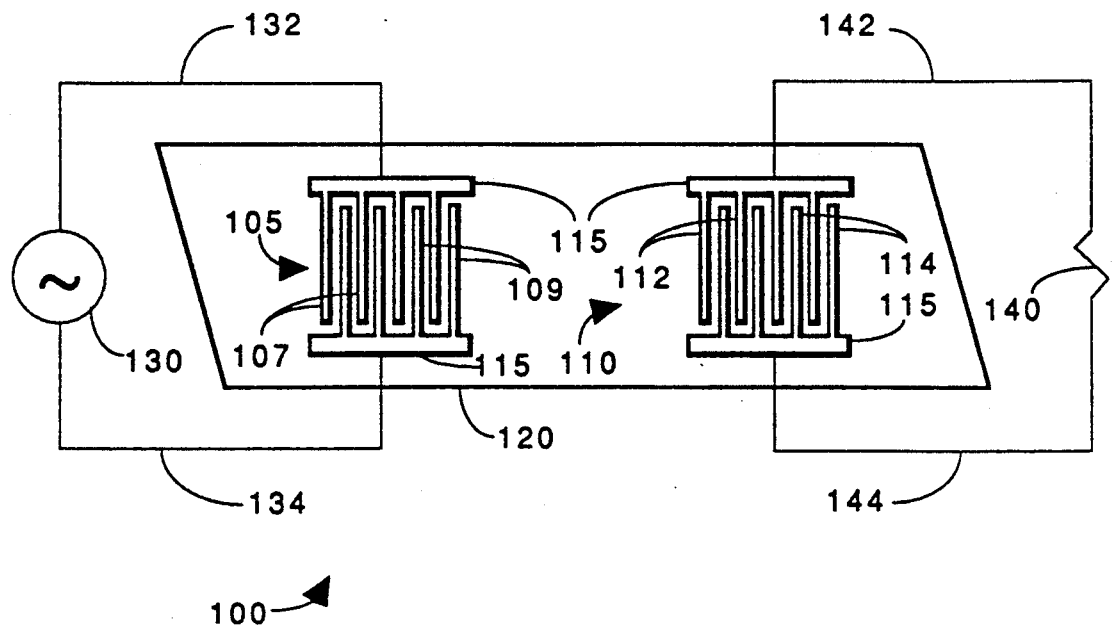
FIG. 1 is a plan view of an acoustic wave filter in accordance with the prior art.

FIG. 1 is a plan view of an acoustic wave filter 100 in accordance with the prior art. Acoustic wave filter 100 comprises substrate 120 and transducers 105, 110 connected to signal source 130 and load 140 via interconnections 132, 134 and 142, 144, respectively. Transducers 105, 110 further comprise busses 115 and comb electrodes 107, 109, 112, 114.

Transducers 105, 110 convert electrical to acoustic energy, and vice versa. Interdigitated comb electrodes 107, 109, 112, 114, interconnected by busses 115, are made of thin-film metal, deposited, for example, by vacuum evaporation, on the polished surface of substrate material 120 which is in whole or in part piezoelectric. Comb electrodes 107, 109, 112, 114 and busses 115 making up acoustic wave transducers 105, 110 are typically defined photolithographically, using processes well known in the art.

The piezoelectric nature of substrate material 120 causes mechanical waves to be emitted from transducer 105 when excited by electrical signals from signal source 130 having an appropriate frequency, and conversely transducer 110 delivers electrical output signals to load 140 when transducer 110 is appropriately insonified.

Alternatively, thin-film overlays of piezoelectric material, for example, ZnO, deposited by dc triode sputtering, can be employed on non-piezoelectric materials such as, for example, single-crystal Si, to allow piezoelectric excitation of acoustic energy on non-piezoelectric substrates.

The piezoelectric overlay material can be deposited over the entire surface of the substrate, or may be limited to transducers 105, 110 alone, for example, by the technique of shadow-masking, as is well known in the art. See, for example, "An integrated ZnO/Si-MOSFET programmable matched filter," by F. S. Hickernell, M. Adamo, A. London, and H. Bush, 1975 IEEE Ultrason. Symp. Proc., pp. 223-226. Surface acoustic waves can be sustained on a broad variety of materials and can be transduced by any means capable of mechanical motion.

SAW devices operate to allow signals at some frequencies to pass from input to output while blocking passage of signals at other frequencies. They thus form electronic filters useful for signal processing and conditioning.

In many types of SAW devices, it is desirable to fashion acoustic reflectors for reversing the direction of propagation of acoustic energy at a specified place. This is accomplished by means of periodic structures of reflection elements composed of grooves, or strips of material, or a combination thereof, placed on or penetrating into the acoustic medium surface.

It is extremely desirable to realize both large and uniform reflection properties from the acoustic reflectors. When the reflection properties of these individual reflection elements are not constant from one to another due to variations in manufacturing tolerances, device performance and so device yields are adversely affected.

Figure 2:
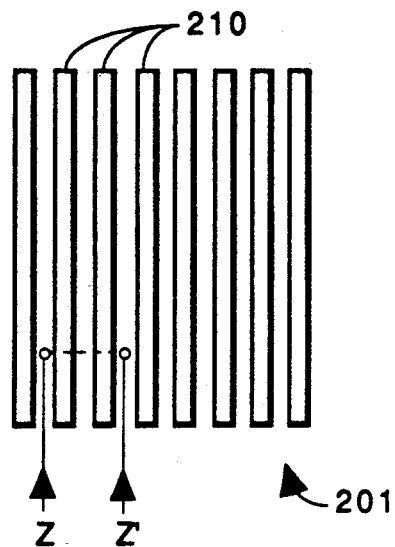
FIG. 2 is a plan view of an acoustic reflector structure in accordance with the prior art.

FIG. 2 is a schematic plan view of prior art acoustic reflector structure 201 comprising reflector elements 210. Reflector elements 210 are oriented such that their long edges are oriented parallel to acoustic equi-phase fronts.

Figure 3:
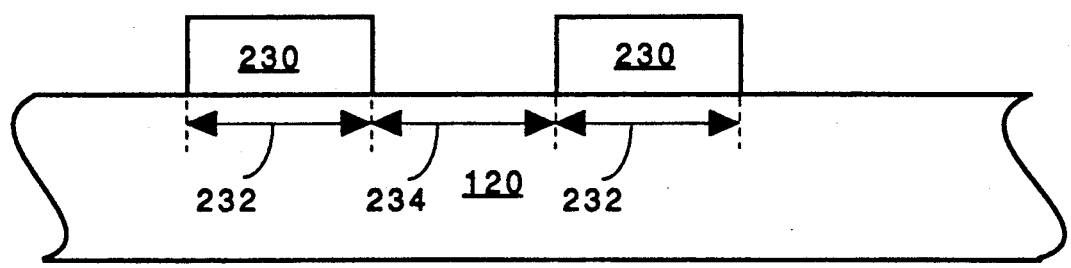
FIG. 3 is an enlarged side view, in section, taken on section lines Z—Z' of FIG. 2, of a portion of an acoustic reflector structure in accordance with the prior art.

FIG. 3 is an enlarged side, view, in section, taken on section lines Z, Z' of FIG. 2 of a portion 205 of the reflection element structure 201 of thereof, in accordance with the prior art. FIG. 3 shows substrate 120 having reflection elements 230 of width 232 and separated by a gap of breadth 234 disposed on substrate 120.

Prior art structures of this type typically have dimensions 232, 234 of about one-fourth of an acoustic wavelength, such that two reflection element widths 242 and gap breadths 234 add up to one acoustic wavelength.

DETAILED DESCRIPTION OF THE DRAWINGS

FIG. 3 illustrates calculated reflectivities 305, 310 of reflection elements composed of conductive electrodes on the surface of a crystal of 128° Y-cut, X-propagating LiNbO$_3$, when the reflection elements are oriented with their long axes normal to the wave propagating direction.

Figure 4:
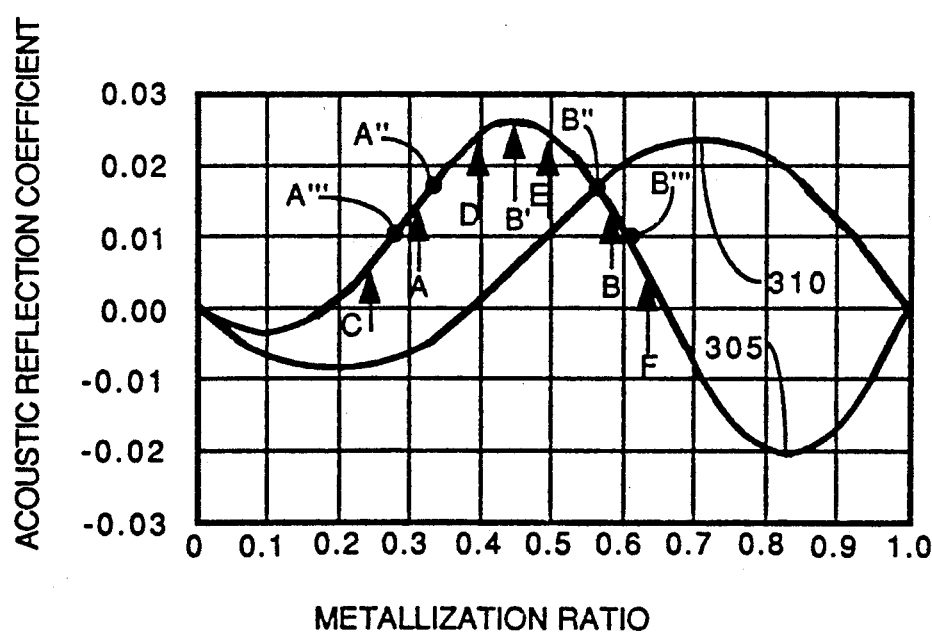
FIG. 4 illustrates calculated reflectivities of reflection elements versus metallization ratio.

Curve 305 describes the reflectivity of a single reflection element per acoustic wavelength versus metallization ratio, while curve 310 describes the reflectivity calculated for two reflection elements per acoustic wavelength versus metallization ratio. FIG. 4 is calculated for aluminum electrodes 3500 Angstroms thick and an acoustic frequency of about 480 MegaHertz, corresponding to an acoustic wavelength of about 8 micrometers and an acoustic velocity of about 3830 meters per second, appropriate to 128° Y-rotated, X-propagating lithium niobate (LiNbO$_3$).

This general curve shape is obtained for a variety of different conditions for this material. The curves plotted in FIG. 4 correspond to a reflection element thickness to acoustic wavelength ratio of 0.044.

Further discussion of acoustic reflections is found in Wright, "Modelling and experimental measurements of the reflector properties of SAW metallic gratings," Proc. 1984 IEEE Ultrason. Symp., pp. 54–63, and also in Penunuri et al., "Single-phase, unidirectional transducer design for charge transport devices," Proc. 1990 Ultrason. Symp., pp. 237–242.

It is observed that acoustic reflection coefficient magnitudes tend to peak for electrode widths of about one-fourth of an acoustic wavelength and tend towards zero for electrode widths of about zero and one wavelengths. For the conditions of electrode widths of zero or one wavelengths, discontinuities are no longer present in the acoustic propagation conditions since the film comprising the electrode is either absent or continuous.

Most surface wave substrates also provide acoustic reflection coefficient magnitudes which tend towards zero at an electrode width of one-half wavelength. This arises because the edges of the reflection element can be modelled as having reflection coefficients of equal magnitude and opposite sign (one reflection element edge comprising a step "up" while the other edge comprises a step back "down").

These edges are separated by a distance of one-half wavelength which a surface wave must traverse twice (once to reach the second edge, and once again for the wave component reflected at the second edge to return to the first edge) for a total phase shift of one cycle, or 360°, equivalent to a phase shift of 0°. This phase shift, added to the two reflection coefficients of the two edges, references the latter to one another and provides a total reflection coefficient of magnitude zero.

Some surface wave substrates provide a peculiar condition wherein portions of the overall reflection coefficient have the same sign at both electrode edges. For these substrates, such as 128° Y-rotated, X-propagating LiNbO$_3$, it is possible to have a peak in the overall acoustic reflection coefficient magnitude at a reflection element width of one-half wavelength.

This peak value can be substantially larger than that which could be otherwise achieved within the linewidth constraints of practical device fabrication techniques. Thus, use of such substrates for SAW filters relying on reflection elements for their electronic properties can provide a powerful new technique.

Applicants have discovered that greater reflectivity can be obtained per unit length on certain materials for certain reflector element thickness to acoustic wavelength ratios by incorporating a single broad reflector element per acoustic wavelength than is obtained by having several smaller reflector elements in the same space. This can be seen by comparison of curves 305 and 310 of FIG. 4. Curve 305 describes the acoustic reflectivity of a single reflection element per acoustic wavelength while curve 310 depicts the acoustic reflectivity obtained for two reflection elements per acoustic wavelength.

A larger value is achieved for curve 305 than for curve 310; for the case of high frequency SAW devices, this difference is large because only the data of the left half of the figure apply. For high frequencies (greater than 750 MegaHertz, for example) it is not practical to attempt to utilize the smaller line- and gap-widths required to realize the reflection magnitudes which correspond to the right half of FIG. 4.

Figure 5:
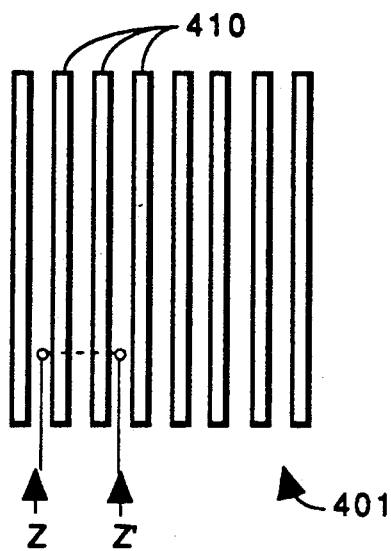
FIG. 5 is a plan view of an acoustic reflector structure in accordance with a preferred embodiment of the present invention.

FIG. 5 is a plan view of an acoustic reflector structure 401 in accordance with a preferred embodiment of the present invention. FIG. 5 illustrates reflection elements 410, all of a single width.

Figure 6:
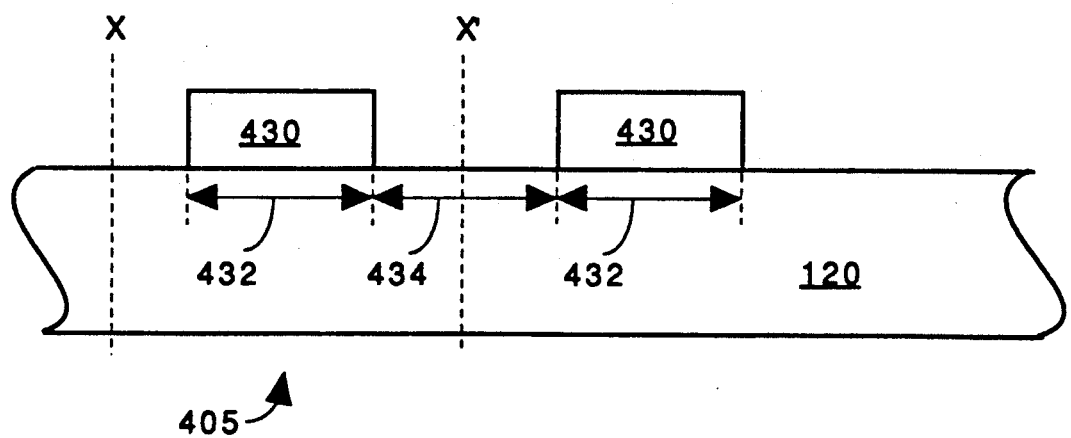
FIG. 6 is an enlarged side view, in section, taken on section lines Z—Z' of FIG. 5, of a portion of the acoustic reflector structure thereof.

FIG. 6 is an enlarged side view, in section, taken on section lines Z—Z' of FIG. 5, of a portion 405 of the acoustic reflector structure 401 thereof. FIG. 6 depicts portion 405 of reflector array 401 of FIG. 5 and comprises substrate 120, reflector elements 430 having width 432, separated by a gap of breadth 434.

The structures of FIGS. 5, 6 provide substantially larger acoustic reflections acoustic wavelength (middle of curve 305 of FIG. 4) than do those of the prior art as shown in FIGS. 2, 3, (middle of curve 310 of FIG. 4) particularly at higher frequencies. This allows greater bandwidths and lower insertion losses to be achieved by the structures of FIGS. 5, 6.

It has been further discovered that this behavior may be used to advantage to achieve aggregate acoustic reflection magnitudes which are insensitive to electrode width variations. This is accomplished by employing multiple electrode widths. This approach is broadly applicable to acoustic substrata, since both positive and negative slopes of reflection coefficient versus reflection element width are available, independent of the materials employed for device realization.

Figure 7:
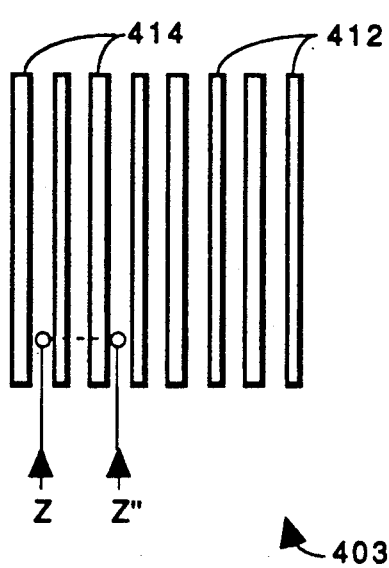
FIG. 7 is a plan view of an acoustic reflector structure in accordance with one embodiment of the present invention.

FIG. 7 is a plan view of an acoustic reflector structure 403 in accordance with one embodiment of the present invention. FIG. 7 illustrates reflection elements 412 of a first width and reflection elements 414 of a second width, arranged such that every other reflection element comprising acoustic reflector 403 is of identical width.

Figure 8:
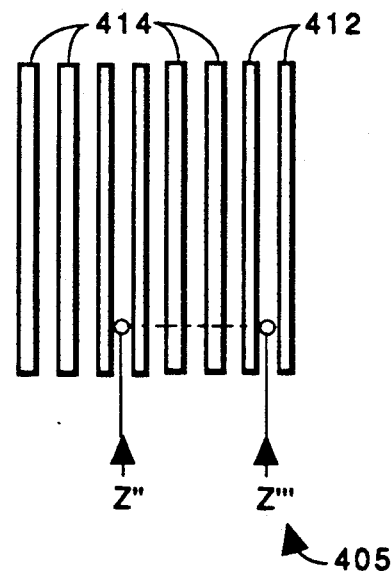
FIG. 8 is a plan view of an acoustic reflector structure in accordance with another embodiment of the present invention.

FIG. 8 is a plan view of an acoustic reflector structure 405 in accordance with another embodiment of the present invention. FIG. 8 illustrates reflection elements 412 of a first width and reflection elements 414 of a second width, arranged such that a pair of one width, for example 414, are adjacent to pairs of another width, for example 412.

Figure 9:
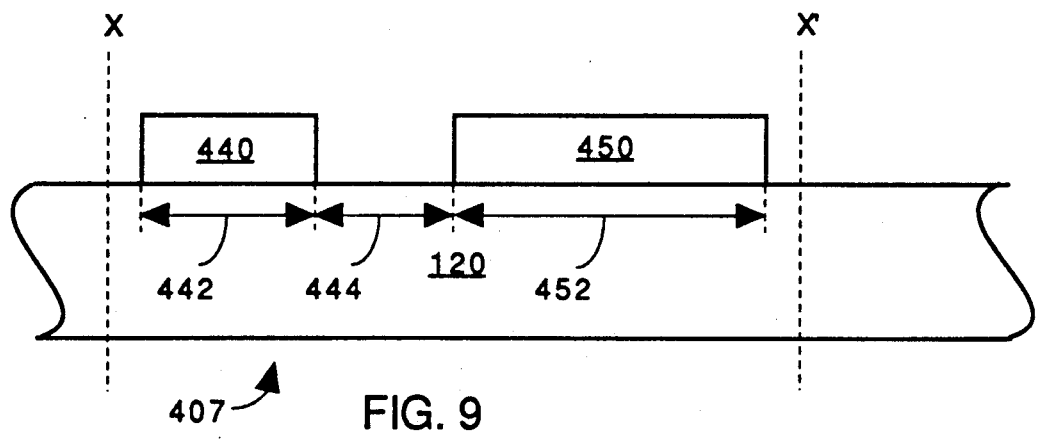
FIG. 9 is an enlarged side view, in section, taken on section Z—Z" of FIG. 7, of a portion of the acoustic reflector structure thereof.

FIG. 9 is an enlarged side view, in section, taken on section lines Z—Z" of FIG. 7, of a portion 407 of the acoustic reflector structure 403 thereof. FIG. 9 depicts two acoustic wavelengths of reflector array 403 of FIG. 7 and comprises substrate 120, reflector elements 450, 440 having widths 452, 442, respectively, separated by a gap of breadth 444.

Figure 10:
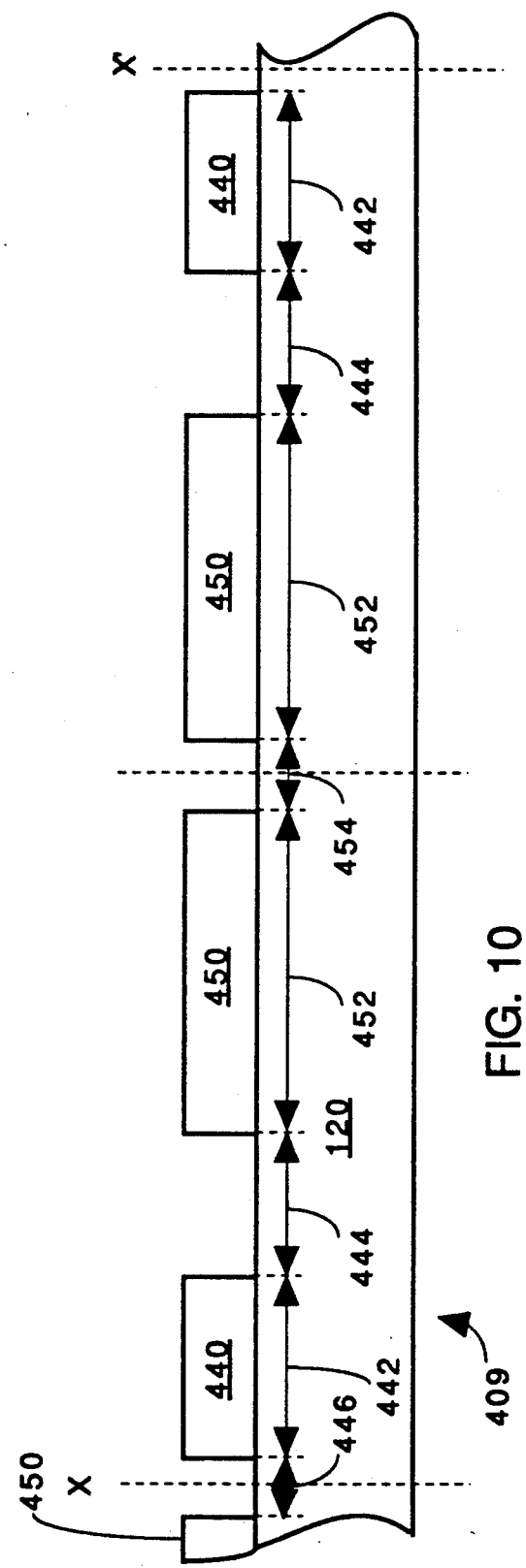
FIG. 10 is an enlarged side view, in section, taken on section lines Z'''—Z'''' of FIG. 8, of a portion of the acoustic reflector structure thereof.

FIG. 10 is an enlarged side view, in section, taken on section lines Z"—Z''' of FIG. 8, of a portion 409 of the acoustic reflector structure 405 thereof. FIG. 4F depicts four acoustic wavelengths of reflector array 405 of FIG. 8, comprising substrate 120, reflector elements 450, 440 having widths 452, 442, respectively, separated by gaps of breadth 446, 444 and 454.

In FIGS. 9, 10, the portions of the figures shown between lines X, X' correspond to the minimum reflection element groupings which can be concatenated to provide acoustic reflector structures 403, 405 of FIGS. 7 and 4D, respectively.

Reflectivities per electrode for electrodes 440, 450 of FIGS. 8 and 10 are shown at locations A and B of FIG. 4. When electrodes 440, 450 have the design target widths 442, 452 indicated by arrows A, B in FIG. 4, they provide equal reflection coefficient magnitudes. In accordance with FIG. 4, width 442 is 0.32λ and width 452 is 0.58λ, for example. This provides gap breadths, for example, of 0.55λ for gap breadth 444 of FIGS. 9 and 10, and gap breadths of 0.145λ and 0.355λ for breadths 454 and 446 of FIG. 10.

Manufacturing variations may cause their widths to be larger or smaller than their design target widths, so that their individual reflection coefficients are no longer equal.

However, by choosing their design widths so that one lies to the left of the peak at B' of curve 305 and the other lies to the right of the peak B' of curve 305, the sum of the reflection coefficients of electrodes 440, 450 remains constant even though the individual reflection coefficients vary.

For example, over-etching of electrodes 440, 450 of FIGS. 9, 10 causes the individual electrode widths and corresponding individual reflection coefficients (shown in FIG. 4) A to shift to A″ and B to shift to B″, while the combined reflection coefficients of A+B=A″+B″. Conversely, under-etching causes A, B to shift to A‴, B‴, respectively, but with A+B=A‴+B‴.

Also shown in FIG. 4 are locations C, D, E, F, wherein C, F correspond to similar magnitudes of reflection coefficient, and analogously, D, E. Acoustic reflectors composed of electrodes of widths C, D, E, F, or C, F, or D, E will also exhibit acoustic reflection properties independent of fabricated electrode width.

Similarly, many other combinations of electrode widths provide this important advantage when these widths are chosen in groups, with each group having total reflection coefficients of similar magnitude and opposed acoustic reflection coefficient slope versus electrode width. The numbers of reflection elements comprising each group may differ.

A further variation is also possible in gap breadth without altering the properties of the acoustic reflector. The arrangement of FIG. 9 may be replicated in two basic fashions to form a reflector array.

These are to concatenate adjacent sections as depicted in FIG. 7 such that X of one section of FIG. 9 corresponds to X′ of the adjacent section, and to concatenate adjacent sections which are mirror images of one another, with X (or X′) of one section corresponding to X (or X′) of the adjacent section. This juxtaposition is illustrated in FIGS. 8, 10.

These two configurations differ in that the arrangement of FIG. 9 comprises two reflection element widths 442, 452 and a single gap breadth 444, whereas FIG. 10 depict two reflection element widths 442, 452 and three distinct gap breadths 444, 446, 454.

Figure 11:
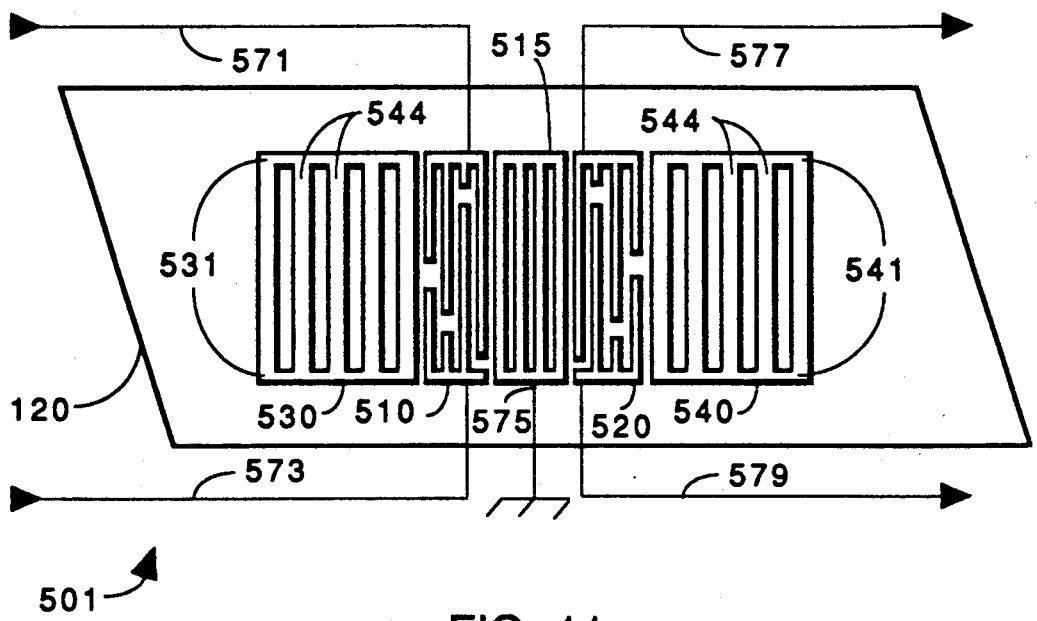
FIG. 11 is a simplified plan view of a SAW resonator in accordance with one embodiment of the present invention.

FIG. 11 is a simplified plan view of a resonator 501 comprising a pair of SAW transducers 510, 520 enclosed between a pair of acoustic reflectors 530, 540 in accordance with the present invention. FIG. 11 also shows an optional group of electrodes 515, optionally connected to ground by lead 575, between acoustic transducers 510, 520, and optional busses 531, 541, connecting reflection elements 544 comprising acoustic reflectors 530, 540, respectively.

SAW transducers 510, 520 are connected to input leads 571, 573 and output leads 577, 579, respectively, for communicating electrical signals to external electronic apparatus (not shown). Electrodes 515 can act to electrically decouple transducers 510, 520, and allowing only a electrical signal resulting from the acoustic waves to contribute to the output signal on leads 577, 579, thus providing improved operation of resonator 501.

Figure 12:
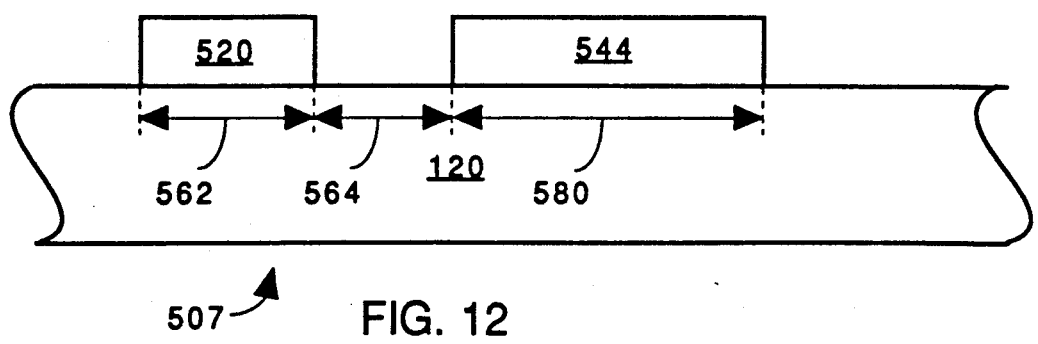
FIG. 12 is a simplified and enlarged side view, in section, of a portion of a SAW resonator in accordance with one embodiment of the present invention.

FIG. 12 is a simplified and enlarged side view, in section, of a portion 507 of a SAW resonator in accordance with one embodiment of the present invention. FIG. 12 comprises acoustic wave propagating substrate 120, transducer electrode 521 having width 562, acoustic reflection element 544 having width 580, separated by a gap of breadth 564. Width 562 is typically in the range from one eighth to one fourth of a wavelength, while width 580 may vary over the range $0.1\lambda \leq w \leq 0.9\lambda$, where w represents width 580, and $\lambda$ represents an acoustic wavelength. Width 580 is about one-half of an acoustic wavelength in a preferred embodiment of the present invention.

In operation, an electrical signal of an appropriate frequency is applied to one transducer, for example 510, causing acoustic energy to be emitted to both the right and to the left. The energy emitted to the left is incident upon acoustic reflector 530, causing this energy to reflect and then to propagate to the right. All of the acoustic energy emitted by transducer 510 is thus incident on transducer 520, and that portion which passes transducer 520 is reflected by reflector 540 and is caused to return to transducer 520.

Extremely efficient transfer of acoustic energy from transducer 510 to transducer 520 is thus possible, in contrast to acoustic devices not employing acoustic reflectors, such as the prior art example shown in FIG. 1.

Figure 13:
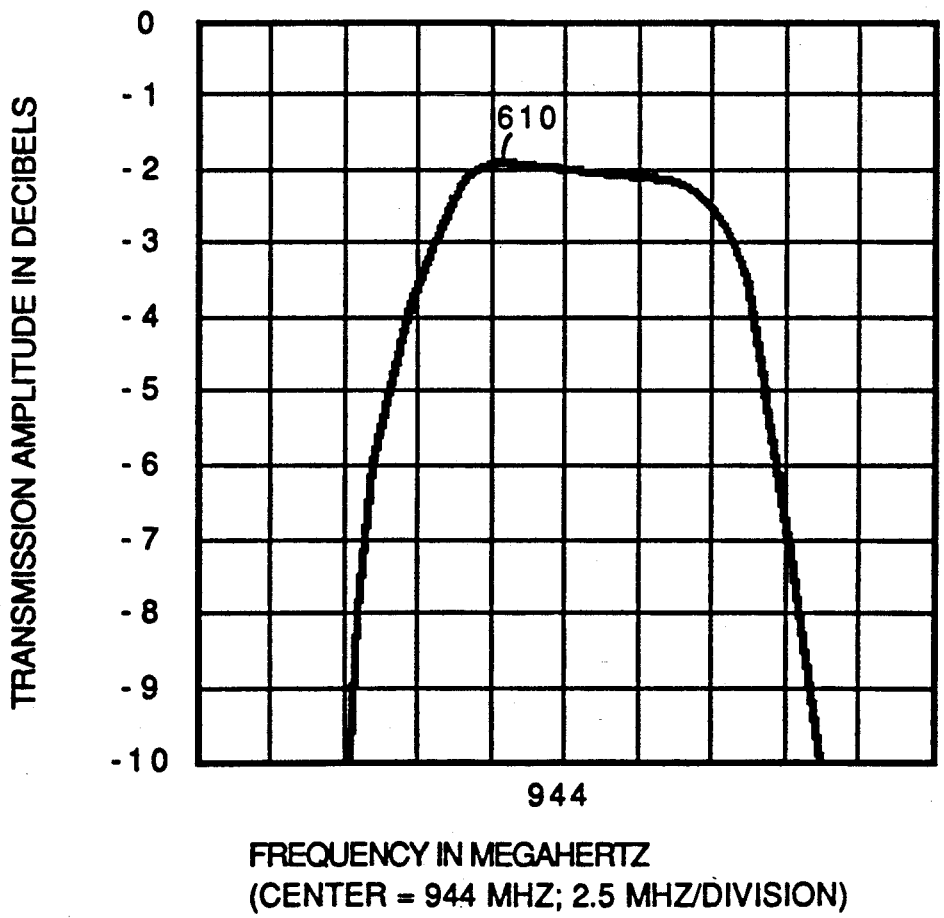
FIG. 13 is a graph of a transmission response of a resonator device in accordance with the present invention.

FIG. 13 is a graph of a transmission response 610 of a resonator device in accordance with the present invention. Data 610 show several interesting and valuable characteristics, including a very high center frequency of 944 MegaHertz, extremely low insertion loss of between 1.9 dB and 2 dB, and a relatively broad 3 dB bandwidth of 7.5 MegaHertz. This combination of characteristics is possible through use of the novel reflection elements described above.

Further, referring to Eq. 1, linewidths of about one micrometer would be required in order to realize a SAW filter at this frequency using prior art techniques. The present invention allows the reflection elements to be constructed using two micrometer reflection element widths for this frequency, while providing roughly an order of magnitude more bandwidth than a conventional SAW resonator.

The present invention thus provides a device design technique which produces acoustic wave filter patterns which are much more easily manufactured, which provide improved fabrication yields, and which accommodate temperature variations more readily than conventional low-loss SAW filter approaches.

This illustrates that the method of using a single reflective element per acoustic wavelength provides the advantages of a very flat transmission characteristic over the filter bandwidth, low insertion loss, broad bandwidth, and high filter operation frequency.

Based on the foregoing description, it will be apparent to those of skill in the art that the present invention solves the problems and achieves the goals set forth earlier, and has substantial advantages as pointed out herein, namely, providing broad bandwidth, low insertion loss, high center frequency capability, and reduced linewidth requirements, together with compact device size.

While the present invention has been described in terms of particular materials, structures and steps, these choices are for convenience of explanation and not intended to be limiting and, as those of skill in the art will understand based on the description herein, the present invention applies to other choices of materials, arrangements and process steps, and it is intended to include in the claims that follow, these and other variations as will occur to those of skill in the art based on the present disclosure.

What is claimed is:

1. An acoustic wave device comprising:
   an acoustic wave propagating substrate;
   a first acoustic wave transducer coupled to said acoustic wave propagating substrate, said first acoustic wave transducer for converting energy between electrical and acoustical form; and a first and a second acoustic reflector coupled to said acoustic wave propagating substrate, said first acoustic reflector disposed on one side of said first acoustic wave transducer, said second acoustic reflector disposed on another side of said first acoustic wave transducer, said first and second acoustic reflectors for reflecting acoustical energy, each of said first and second acoustic reflectors including a plurality of acoustic reflection elements wherein there is a single acoustic reflection element per acoustic wavelength.

2. The acoustic wave device as claimed in claim 1, wherein there is further included a second acoustic wave transducer coupled to said acoustic wave propagating substrate, said second acoustic wave transducer for converting energy between electrical and acoustical form, said second acoustic wave transducer placed adjacent to said first acoustic wave transducer between said first and second acoustic reflectors.

3. The acoustic wave device as claimed in claim 2, wherein there is further included a plurality of grounded electrodes disposed between said first and second acoustic wave transducers, said plurality of grounded electrodes coupled to said acoustic wave propagating substrate, said plurality of grounded electrodes for electrically decoupling said first and second acoustic wave transducers.

4. The acoustic wave device as claimed in claim 3, wherein each of said plurality of acoustic reflection elements comprises a metal strip having a width w, measured in a direction of acoustic wave propagation, where said width w is such that:

$$0.1\lambda \leq w \leq 0.9\lambda,$$

and wherein $\lambda$ denotes an acoustic wavelength of said first acoustic wave transducer.

5. The acoustic wave device as claimed in claim 1, wherein said acoustic wave propagating substrate includes 128° Y-rotated, X-propagating lithium niobate.

6. The acoustic wave device as claimed in claim 1, wherein said plurality of acoustic reflection elements comprises metal strips.

7. The acoustic wave device as claimed in claim 1, wherein said plurality of acoustic reflection elements of said first and second acoustic reflectors includes a plurality of acoustic reflection elements of at least two different widths.

8. The acoustic wave device as claimed in claim 7, wherein said plurality of acoustic reflection elements includes an alternating structure comprising at least one of said acoustic reflection elements of a first width and at least one of said acoustic reflection elements of a second width.

9. The acoustic wave device as claimed in claim 8, wherein there is further included N replications of said alternating structure, where N is an integer.

10. A method for making an electro-acoustic device comprising the steps of:

providing an acoustic wave propagating substrate; and disposing a first acoustic wave transducer and a first and a second acoustic reflector on the acoustic wave propagating substrate, wherein each of said first and second acoustic reflectors comprises a plurality of reflection elements located on the acoustic wave propagating substrate, the first acoustic reflector being positioned to one side of the first acoustic wave transducer, the second acoustic reflector being positioned to another side of the first acoustic wave transducer, wherein the plurality of reflection elements have a periodicity of one reflection element per an acoustic wavelength.

11. The method as claimed in claim 10, wherein said disposing step includes the step of disposing a second acoustic wave transducer on the acoustic wave propagating substrate between the first and second acoustic reflectors.

12. The method as claimed in claim 11, wherein said disposing step further includes the step of disposing a plurality of grounded electrodes between the first and second acoustic wave transducers, the plurality of grounded electrodes electrically decoupling the first and second acoustic wave transducers.

13. The method as claimed in claim 10, wherein said step of providing further includes the step of providing an acoustic wave propagating substrate of 128° Y-rotated, X-propagating lithium niobate.

14. The method as claimed in claim 10, wherein said step of disposing comprises the step of disposing a plurality of reflection elements, each of the plurality of reflection elements having a width w, measured in a direction of acoustic wave propagation, where the width w is such that:

$$0.1\lambda \leq w \leq 0.9\lambda,$$

and wherein $\lambda$ denotes an acoustic wavelength of the first acoustic wave transducer.

15. The method as claimed in claim 10, wherein said step of disposing comprises the step of disposing reflection elements of a plurality of different widths.

16. The method as claimed in claim 15, wherein said step of disposing comprises the step of disposing a plurality of acoustic reflection elements comprising at least one acoustic reflection element of a first width and at least one acoustic reflection element of a second width.

17. An acoustic wave device comprising:

an acoustic wave propagating substrate of 128° Y-rotated, X-propagating lithium niobate;

a first acoustic wave transducer coupled to said acoustic wave propagating substrate, said first acoustic wave transducer for converting energy between electrical and acoustical form; and a first and a second acoustic reflector coupled to said acoustic wave propagating substrate, said first acoustic reflector disposed to one side of said first acoustic wave transducer, said second acoustic reflector disposed to another side of said first acoustic wave transducer, said first and second acoustic reflectors wherein there is a single acoustic reflection element per acoustic wavelength.

18. The acoustic wave device as claimed in claim 17, further comprising:

a second acoustic wave transducer coupled to said acoustic wave propagating substrate, said second acoustic wave transducer for converting energy between electrical and acoustical form, said second acoustic wave transducer placed adjacent to said first acoustic wave transducer and between said first and second acoustic reflectors.

19. The acoustic wave device as claimed in claim 17, wherein there is further included a plurality of electrodes disposed in between said first and second acoustic wave transducers.

20. The acoustic wave device as claimed in claim 17, wherein said acoustic reflection elements comprise metal strips having a width w, measured in a direction of acoustic wave propagation, where said width w is such that:

$0.1\lambda \leq w \leq 0.9\lambda,$ and wherein $\lambda$ denotes an acoustic wavelength.

21. The method as claimed in claim 10, wherein said disposing step includes the step of disposing a first and a second acoustic reflector comprising aluminum on the acoustic wave propagating substrate.

22. The acoustic wave device as claimed in claim 17, wherein said acoustic reflection elements comprise aluminum strips having a width w, measured in a direction of acoustic wave propagation, where said width w is such that:

$0.1\lambda \leq w \leq 0.9\lambda,$ and wherein $\lambda$ denotes an acoustic wavelength.

* * * * *